(12) United States Patent  
Bowlerwell (10) Patent No.: US 10,725,121 B2  
(45) Date of Patent: Jul. 28, 2020

(54) SOCKET MONITORING

(71) Applicant: Cirrus Logic International Semiconductor Ltd., Edinburgh (GB)

(72) Inventor: John Bruce Bowlerwell, Dunfermline (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/164,478

(22) Filed: Oct. 18, 2018

(65) Prior Publication Data

US 2019/0128949 A1     May 2, 2019

Related U.S. Application Data

(60) Provisional application No. 62/577,769, filed on Oct. 27, 2017.

(30) Foreign Application Priority Data

Dec. 1, 2017 (GB) .................................. 1720017.1

(51) Int. Cl.
*G01R 31/68* (2020.01)
*H04R 29/00* (2006.01)
(Continued)

(52) U.S. Cl.
CPC .............. *G01R 31/68* (2020.01); *H04R 5/04* (2013.01); *H04R 29/00* (2013.01); *H01R 24/58* (2013.01);
(Continued)

(58) Field of Classification Search
CPC ...... G01R 31/043; G01R 3/045; H01R 24/58; H01R 2105/00; H01R 13/641;
(Continued)

(56) References Cited

U.S. PATENT DOCUMENTS 5,852,769 A * 12/1998 Ahmed ............... H04M 1/6008
455/116
7,130,184 B2 * 10/2006 Choi ..................... H03G 3/001
361/679.23
(Continued)

FOREIGN PATENT DOCUMENTS

KR      102013001 A      1/2013
WO      2012012331 A1    1/2012

OTHER PUBLICATIONS

International Search Report and Written Opinion of the International Searching Authority, International Application No. PCT/GB2018/053011, dated Jan. 3, 2019.
(Continued)

*Primary Examiner* — Davetta W Goins
*Assistant Examiner* — Kuassi A Ganmavo
(74) *Attorney, Agent, or Firm* — Jackson Walker L.L.P.

(57) ABSTRACT

This applications relates to methods and apparatus for monitoring a socket (101), to detect a connection status of a mating plug (102), e.g. for monitoring an audio jack socket for connection of an audio jack plug. A monitor (115, 305) is configured to monitor a voltage ($V_M$) at a monitoring node (114), which is coupled to a jack detect contact (112) of the socket and a voltage pull-up element (113). The voltage ($V_M$) at the monitoring node (114) is monitored against a threshold (Vthv) and a threshold module (302) is configured to vary the threshold depending on an indication of signal activity ($S_{ACT}$) of a signal path for a first socket contact (103) which will be electrically connected to the jack detect contact when a plug when inserted in the socket.

20 Claims, 4 Drawing Sheets

(51) Int. Cl.
*H04R 5/04* (2006.01)
*H04R 3/00* (2006.01)
*H01R 24/58* (2011.01)
*H01R 105/00* (2006.01)
*H04M 1/60* (2006.01)

(52) U.S. Cl.
CPC ....... *H01R 2105/00* (2013.01); *H04M 1/6058* (2013.01); *H04R 3/00* (2013.01); *H04R 2205/021* (2013.01); *H04R 2420/05* (2013.01); *H04R 2420/09* (2013.01)

(58) Field of Classification Search
CPC ............ H01R 13/6691; H01R 2107/00; H01R 2205/021; H04R 5/04; H04R 2420/05; H04R 2420/09; H01B 2105/00; H01B 2107/00; H01B 2205/021
See application file for complete search history.

(56) References Cited

U.S. PATENT DOCUMENTS

| | | | | |
|---|---|---|---|---|
| 2007/0133829 A1* | 6/2007 | Kanji | .................... | H01R 29/00 381/123 |
| 2010/0194561 A1* | 8/2010 | Motoyama | .......... | H04M 1/6008 340/540 |
| 2010/0272252 A1* | 10/2010 | Johnson | ............... | H04R 1/1041 379/430 |
| 2013/0140913 A1* | 6/2013 | Inha | ..................... | H03K 17/687 307/126 |
| 2013/0142350 A1* | 6/2013 | Larsen | ................. | H04R 1/1041 381/74 |
| 2013/0158919 A1* | 6/2013 | Shah | ........................ | H04R 5/04 702/64 |
| 2014/0225632 A1 | 8/2014 | Oh et al. | | |
| 2015/0326970 A1* | 11/2015 | Miske | .................. | H04R 1/1041 381/123 |
| 2016/0165336 A1* | 6/2016 | Di Censo | ................ | H04S 7/304 381/80 |
| 2016/0329867 A1* | 11/2016 | Lesso | .................... | H03F 1/3241 |
| 2016/0380394 A1 | 12/2016 | Park et al. | | |
| 2017/0272877 A1* | 9/2017 | Roh | ..................... | H04R 29/001 |
| 2018/0014116 A1 | 1/2018 | Roh et al. | | |

OTHER PUBLICATIONS

Combined Search and Examination Report under Sections 17 and 18(3), UKIPO, Application No. GB1720017.1, dated May 31, 2018.

\* cited by examiner

SOCKET MONITORING

TECHNICAL FIELD

The field of representative embodiments of this disclosure relates to methods, apparatus and/or implementations concerning or relating to monitoring of a socket and in particular to monitoring a socket to detect a connection status, e.g. connection or disconnection of a suitable mating plug.

BACKGROUND

Many contemporary electronic devices have the facility to connect with an accessory apparatus such as a peripheral audio apparatus. For instance, mobile telephones, tablets, laptop computers and the like are examples of electronic devices that are operable with an accessory apparatus such as a headset, for example, that is external to and distinct from the electronic device. Headsets typically comprise mono or stereo speakers for audio playback and a microphone for voice communication.

Such external accessory apparatus may, in use, be physically connected to the electronic device via a mating connector such as a plug and socket arrangement. For instance, many headsets have a jack plug for connection to a suitable jack socket on the host electronic device. A well-known arrangement for a jack plug and its associated socket is the 3.5 mm TRRS (Tip-Ring-Ring-Sleeve), which has four contacts for left audio, right audio, microphone, and ground return. In one known arrangement, the tip (T) and first ring (R1) are used for left (L) and right (R) audio respectively, for example left and right loudspeakers, with the second ring (R2) and sleeve (S) used for the ground (G) and microphone (M) respectively. It will be appreciated that different arrangements for the left and right audio, microphone, and ground contacts are also possible.

Advantageously the electronic device should be able to automatically detect whether or not an accessory such as a peripheral audio device is connected. Typically therefore the device will include a socket monitoring arrangement associated with the socket to detect whether or not a suitable mating plug is correctly inserted in the socket.

In some instances the socket monitoring arrangement may comprise a mechanical switch which is activated by insertion or removal of a plug from the socket. For instance a mechanical switch could be located at the end of the socket and biased to a first state, e.g. open, if a plug is not fully inserted but which is moved to the other state, e.g. closed, when a plug is fully inserted. Mechanical switches may however be subject to wear and tear in use and may fail over time or the action of the switch may become blocked by dirt etc. accumulating in the socket.

As an alternative in some instances independent first and second socket contacts may be arranged to contact one pole of the plug, usually the tip, when correctly inserted and the electrical properties of the first and second socket contacts monitored. When the plug is fully inserted the first and second socket contacts are effectively shorted together via a low resistance path provided by the tip of the plug. When the plug is removed the first and second socket contacts are open circuit. The electrical properties of the first and second socket contacts may be monitored to detect when the two contacts are electrically connected as an indication of the mating status of the plug. However the distance between the first and second socket contacts is relatively small and moisture within the socket, or some dirt or foreign objects could provide a conductive pathway between the contacts.

SUMMARY

Embodiments of the present invention relate to improve methods and apparatus for monitoring of a socket to determine a connection status, in particular to detecting whether a mating plug is connected or has been disconnected.

According to some embodiments there is provided a socket monitoring circuit comprising:

a monitor configured to monitor a voltage at a monitoring node against a variable threshold;

wherein the monitoring node is coupled, in use, to a jack detect contact of the socket and a voltage pull-up element; and a threshold module configured to vary said variable threshold depending on an indication of signal activity of a signal path for a first socket contact to which the monitoring node may be electrically connected via a pole of a plug when inserted in the socket.

In some embodiments the threshold module may be configured to set the variable threshold to a first value when the indication of signal activity indicates a first level of activity and to set the variable threshold to a second value, higher than the first value, when the indication of signal activity indicates a second greater level of activity.

In some implementations the indication of signal activity may be an indication of activity of an audio signal path for supplying an audio driving signal to the first socket contact of the socket.

The first socket contact may be a tip contact of the socket for contacting a tip pole of a plug when fully inserted in the socket.

In some implementations the indication of signal activity may comprise an indication of output signal level for an output of a first driving circuit coupled, in use, to the first socket contact. The threshold module may be configured to receive the indication of output signal level from the first driving circuit or may be configured to receive the indication of output signal level from a processing module upstream of the first driving circuit. In some implementations the indication of signal activity may, additionally or alternatively, comprise an indication of whether a driver component of a driving circuit for providing a driving signal to the first socket contact is enabled or not. The driver component of the driving circuit may comprise an amplifier. In some implementations the indication of signal activity may, additionally or alternatively, comprise an indication of whether a clamp switch for clamping the signal path for the first socket contact to ground is enabled or not. In some implementations the indication of signal activity may, additionally or alternatively, comprise an indication of a volume control signal.

In some implementations a parameter of the pull-up element may be variable so as to vary a magnitude of expected current flow between the pull up-element and the jack detect contact of the socket in the event that the jack detect contact is electrically connected to the first socket contact. The monitoring circuit may be configured to vary the parameter of the pull-up element based on said indication of signal activity. The monitoring circuit may be configured to vary the parameter of the pull-up element so as to provide a higher magnitude of expected current flow when the indication of signal activity indicates that there is some signal activity at said first socket contact than when the indication of signal activity indicates that there is substantially no signal activity at said first socket contact. In some implementations the threshold module may be configured to vary the parameter of said pull-up element when varying the variable threshold. The parameter of the pull-up element may comprise a value of resistance coupled, in use, between a first voltage and the monitoring node. The parameter of the pull-up element may comprise an output current of a programmable current source arrangement.

The pull-up element may, in some implementations, comprise at least a first resistor coupled, in use, between a first voltage and the monitoring node. In some implementations the pull-up element may comprise a current source.

The monitor may comprise at least one comparator for comparing the voltage at the monitoring node with the variable threshold.

The socket monitoring circuit may further comprise a controller responsive to the monitor and configured to determine a connection status of a plug based on the output of the monitor. The controller may be configured to control operation of at least one signal path to one of the socket contacts based on the determined connection status. The controller may additionally or alternatively be configured to determine disconnection of a plug from the socket in the event the output of the monitor changes state to indicate that the voltage at the monitoring node has increased from below the variable threshold to above the variable threshold. In the event that the controller determines disconnection of a plug from the socket, the controller may be configured to generate a control signal to disable a microphone bias from being applied to a socket contact of the socket and/or to generate a control signal to enable a clamp switch to clamp a path for a microphone bias to ground.

The socket monitoring circuit may be implemented as at least part of an integrated circuit. In some embodiments the integrated circuit may comprise an audio codec.

Embodiments also relates to an apparatus comprising a socket monitoring circuit as described in any of the variants herein and a socket for receiving a mating plug of an accessory apparatus; the socket comprising the jacket detect contact and the first socket contact arranged so as to contact the same pole of the mating plug when inserted into the socket. The socket may, in some instances, be a 3.5 mm TRRS socket.

Embodiments also relates to an electronic device comprising the apparatus. The device may be at least one of: a portable device; a battery powered device; a communications device; a mobile or cellular telephone or a smartphone; a computing device; a laptop, notebook or tablet computing device; a voice controlled or voice activated device; a wearable device; a domestic appliance.

Aspects also relate to an apparatus comprising:
a socket for receiving a mating plug of an accessory apparatus,
a first audio driver for outputting an audio drive signal to a first contact of the socket;
a jack detect contact configured such that the jack detect contact and first socket contact make contact with a same pole of the mating plug when inserted;
a voltage pull up element coupled to the jack detect contact; and
a monitor for monitoring the voltage at the jack detect contact with a threshold controlled by a threshold module;
wherein the threshold module is configured to controllably vary said threshold based on an indication of the output activity of the first audio driver.

Aspects also relate to a socket monitoring circuit comprising: a monitor configured to monitor a voltage at a monitoring node against a threshold; wherein the threshold is variable based on an indication of signal level output from an audio circuit to the socket.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to methods and apparatus for monitoring of a socket of a device to determine a connection status, i.e. to determine when a mating plug is fully inserted in the socket.

Figure 1A:
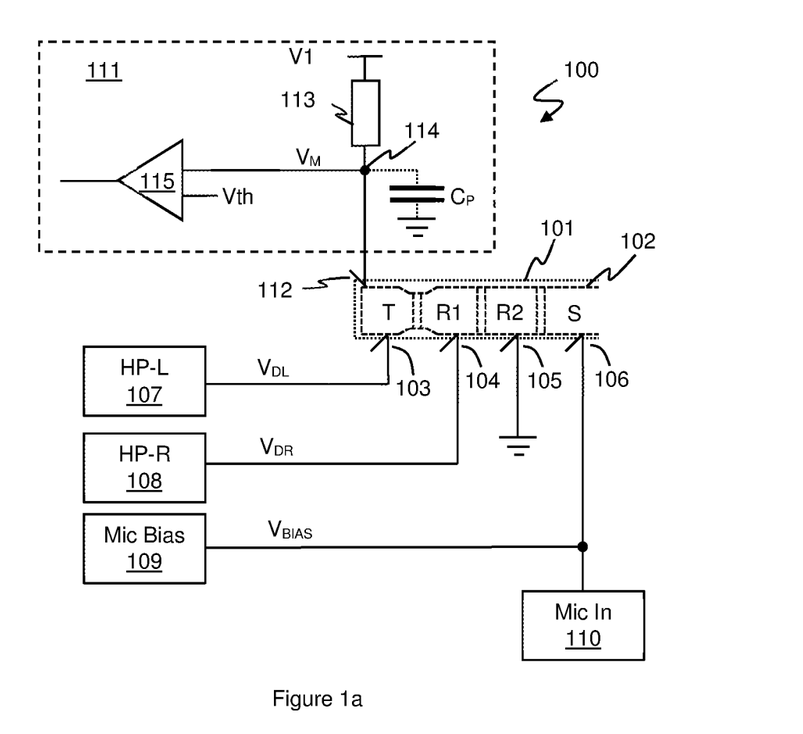
FIG. 1a illustrates one example of a socket arrangement with socket monitoring circuitry and FIG. 1b illustrates one example of audio apparatus of an accessory apparatus.

FIG. 1a illustrates generally one example of circuit arrangement 100 for monitoring a socket 101 of a device. In this example the socket 101 is a jack socket suitable for receiving a 4-pole jack plug, for instance a 3.5 mm TRRS jack plug as is well known for transfer of audio signals. Such a plug has four poles, T (tip), R1 (ring 1), R2 (ring 2) and S (sleeve) as will be understood by one skilled in the art.

Four socket contacts 103-106 are arranged within the socket 101 so as to contact the respective T, R1, R2 and S poles of the plug 102 when fully inserted into the socket 101. In use various signals may be transferred to and from the socket contacts 103-106 for operating a connected accessory apparatus. FIG. 1 illustrates one configuration for use with an audio accessory having stereo loudspeakers and a microphone. First and second audio driver circuits 107 and 108, e.g. comprising headphone driver amplifiers or the like, are connected to supply audio drive signals to socket contacts 103 and 104 respectively. Typically connections are made to drive the T pole with a left audio drive signal $V_{DL}$ and the R1 pole with a right audio drive signal $V_{DR}$.

One socket contact, in this illustrated example contact 105, is connected to provide a ground return path to a pole of the plug 102 (in this example the R2 pole), and the other socket contact, in this example socket contact 106, is used for the microphone. A microphone biasing circuit 109 provides a bias voltage $V_{BIAS}$ to the socket contact 105 to bias the microphone of the accessory apparatus and a microphone input circuit 110 monitors the socket contact 106 to detect any input microphone signal.

Figure 1B:
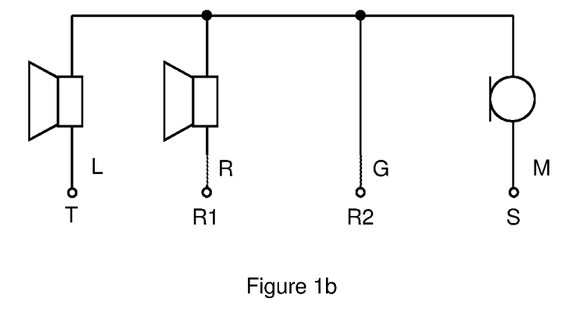

FIG. 1b illustrates the corresponding connections within an accessory apparatus and illustrates that the T and R1 poles of the plug 102 may be connected to respective loudspeakers for left and right audio L and R, and the S pole connected to a microphone M, with the loudspeakers and microphone also being connected to the R2 pole to provide a ground return path G.

It will be understood by one skilled in the art that the arrangement illustrated in FIGS. 1a and 1b corresponds to one possible configuration and other configurations are known, for instance some accessories use the R2 pole for the microphone and the S pole for ground. The socket circuitry may also be configurable for use with devices without a microphone and which use a 3-pole jack plug and/or may be configurable for use with other accessories, which may be non-audio accessories.

To provide jack detection monitoring, i.e. detection of whether or not a jack plug 102 is inserted in the jack socket 101, monitoring circuitry 111 may be coupled to a jack detect contact 112 of the socket 101. The jack detect contact 112 is arranged so as to contact one of the poles of the jack plug 102, when fully inserted, such that the jack detect contact 112 contacts the same pole of the plug 102 as one of the other socket contacts 103-106, typically the first socket contact 103 for connecting the tip T pole, which, as discussed above, may, in use, be coupled to the first audio driver circuit 107.

The monitoring circuitry 111 comprises a pull-up element 113, which in this example comprises a resistor coupled between a first voltage V1 and a monitoring node 114. The monitoring node 114 is, in use, electrically coupled to the jack detect contact 112. The monitoring node 114 is also coupled to a monitor 115, which in this example comprises a comparator for comparing a voltage at the monitoring node 114 to a threshold voltage Vth.

In use, if no jack plug 102 is present in the jack socket 101, the jack detect contact 112 should be electrically isolated from the first socket contact 103, that is the relevant two contacts are open circuit. In this state, the pull up element 113 thus results in the voltage $V_M$ at the monitoring node 114 being pulled high to substantially the first voltage V1.

When the plug 102 is fully inserted into the socket, the tip T pole of the plug 102 electrically connects the jack detect contact 112 to the first socket contact 103. The first socket contact 103 is connected to the audio driver circuit 107, which has an output that is typically clamped to ground when the audio driver circuit 107 is not in use and which otherwise is ground referenced. This provides a circuit path for current flow between the jack detect contact 112 and the first socket contact 103 and results in the voltage $V_M$ at the monitoring node 114 being pulled down below the first voltage V1 when a plug 102 is correctly inserted in the socket 101.

The threshold voltage Vth is conventionally set such that, with the plug 102 present, the voltage $V_M$ at the monitoring node 114 drops below the threshold Vth, but if the plug 102 is not present the voltage $V_M$ at the monitoring node 114 will be above the threshold Vth. For example, in some instances the first voltage V1 may be a voltage available to the audio driver circuitry, e.g. headphone amplifier circuitry 107, and may for instance be a voltage in the range of about 1.5-2V.

The voltage threshold Vth could conventionally be set to be in the region of 70-90% of the first voltage V1. The resistance of pull-up resistor 113 may be chosen to provide a sufficient pull-up action for clear detection of when a plug 102 is inserted, but without resulting in any significant audible artefacts being generated on plug insertion or removal. For example a resistance of the order of a megaohm or so may be used in some conventional implementations.

The comparator 115 monitors the voltage $V_M$ at the monitoring node 114 against the threshold Vth. The output of the comparator 115 indicates whether or not the monitored voltage is above the threshold Vth and can be used as an indication of whether or not a jack plug 102 is inserted.

Such an arrangement avoids the need for any mechanical switch for jack detection and the associated problems therewith.

However a problem can arise if moisture is present within the socket 101. Moisture within the socket 101 may provide a conductive path between the jack detect contact 112 and the first socket contact 103. Any significant current flow due to moisture is disadvantageous and could result in damage to or corrosion of the contacts, e.g. through oxidation.

To reduce the extent of any current flow that may occur when moisture is present in the socket 101, the pull-up element 113 could be arranged to provide a relatively limited current in use. For instance the resistor 113 could be a relatively high value resistor. For example a resistance say of the order of a few tens of megaohms or so may limit the extent of any current due to moisture to acceptable limits in some implementations.

However using a high value of resistance for pull-up resistor 113, or otherwise limiting the current that is provided by the pull-up element, can introduce a time lag into detection of connection and/or disconnection. In practice there will be some stray or parasitic capacitance $C_P$ associated with the monitoring node 114 and corresponding conductive paths of the monitoring circuit and path to the jack detect contact 112. The pull-up resistor 113, together with such a parasitic capacitance $C_P$, effectively act as a low-pass filter with a time constant that is proportional to the value of the resistance. Thus a high value of resistance for pull-up resistor 113 can result in the voltage $V_M$ at the monitoring node only changing relatively slowly.

For instance consider that a plug 102 is present in the socket 101, so that the jack detect socket contact 112 is electrically connected to the first socket contact 103 via the T pole of the plug. If the first socket contact 103 is at ground, and the plug 102 has been present for a relatively long period of time, the voltage $V_M$ at the monitoring node 114 will have been pulled down to be substantially at ground. The output of comparator 115 will, in this situation, indicate that the voltage $V_M$ at the monitoring node 114 is below the threshold Vth and thus indicate that the plug 102 is inserted.

Figure 2:
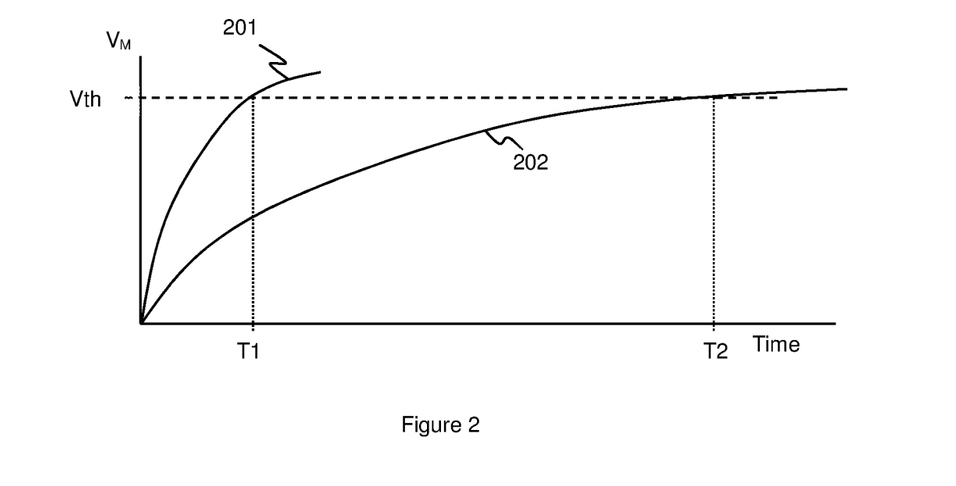
FIG. 2 illustrates plots of how voltage at a monitoring node may change over time for different values of pull-up resistance.

If the plug 102 is then removed, the jack detect contact 112 will be electrically disconnected from the first socket contact 103, i.e. disconnected from ground, and the voltage $V_M$ at the monitoring node will rise over time, as illustrated in FIG. 2. FIG. 2 shows a plot 201 of how the voltage $V_M$ at the monitoring node 114 may increase over time, starting from ground at the time that the pole T of the plug 102 is first disconnected from the jack detect contact 112 and/or first socket contact 103, and rising to the threshold voltage Vth at a time T1. At the time T1 the output of the comparator 115 would change state thus indicating the plug 102 has been removed.

The time taken the reach the threshold will depend on the resistance of pull-up resistor 113, or more generally by the current delivered by the pull-up element 113 (simplistically the time taken to charge the parasitic capacitance $C_P$). The higher the resistance of pull-up resistor 113, the longer it will take for the voltage $V_M$ at the monitoring node 114 to reach the threshold Vth. FIG. 2 also illustrates a plot 202 of how the voltage $V_M$ may rise over time following disconnection of the plug 102, but for a second, higher value of resistance for pull-up resistor 113. The time between disconnection of the plug 102 from the jack detect contact 112 and/or first socket contact 103 and the time T2 at which the voltage $V_M$ reaches the threshold Vth is greater in this instance, with the respective period being proportional to the value of resistance of the pull-up resistor 113.

A high value of resistance for the pull-up resistor 113 can therefore result in the monitoring circuitry 111 taking a relatively long time to register that the jack detect contact 112 has been disconnected from the first socket contact 103, indicating removal of the plug 102.

In general it may be desirable to register electrical disconnection of the jack detect contact 112 from the first socket contact 103 relatively quickly. In particular it may be desirable to detect when the plug 102 is in the process of being removed from the socket 101 so as to control the signals/voltages applied to at least one of the other socket contacts 104-106 to reduce the possibility of unwanted audible artefacts.

As discussed above the jack plug 102 may comprise a linear arrangement of poles, and the tip T and first ring R1 poles of the jack plug 102 may be coupled to loudspeakers of the accessory apparatus, e.g. as illustrated in FIG. 1b. As also discussed, in use a bias voltage $V_{BIAS}$ for the microphone of the accessory apparatus may be developed and supplied to socket contact 106 (or socket contact 105 in some configurations). On removal of the jack plug 102 from the socket 101, various poles of the plug may be moved past socket contacts to which they are not normally connected. This may cause electrical currents to pass through loudspeakers attached to these poles and produce audible artefacts. For instance, if the plug illustrated in FIG. 1a is pulled one step to the right relative to the socket contacts, then the plug contact R2 (wired to the ground return path from the accessory as illustrated in FIG. 1b) will contact socket contact S, which connected to the microphone bias circuitry 109. At the same time, the plug contact R1 (wired to the right loudspeaker) will be connected to socket contact R2 (connected to ground). Thus if the microphone bias circuitry is still active, the right loudspeaker will become subject to the microphone bias $V_{BIAS}$ being applied at one terminal and ground at the other, and will pass a resulting current, producing an audible click or thump, which is undesirable.

It may therefore be desirable that the monitoring circuitry 111 detects electrical disconnection of jack detect contact 112 from the first socket contact 103 sufficiently fast that the microphone bias $V_{BIAS}$ can be substantially disabled, i.e. removed, before the R1 and R2 poles of the plug are likely to come into contact with the socket contact 106 to which the microphone bias $V_{BIAS}$ is applied. The jack detect contact 112 may be positioned so it makes contact with the T pole of the plug 102 at, or near, the far end of the tip, so that, as soon as the plug 102 starts to be removed from the socket 101, the jack detect contact 112 is electrically disconnected from the first socket contact 103.

In some implementations it may be desirable to disable the microphone bias $V_{BIAS}$ within a few hundred microseconds from the onset of the plug 102 being removed from the socket 101, e.g. from the time at which the jack detect contact 112 is electrically disconnected from the first socket contact 103.

For an arrangement such as illustrated in FIG. 1 the monitoring circuitry 111 may, in some implementations, be operable to detect disconnection of the jack detect contact 112 from the first socket contact 103 in a period less than 100 microseconds, when using a resistance value of about 1 MΩ for the pull-up resistor 113. However as noted above it may be preferred in some implementations to have a significantly higher value of resistance for the pull-up resistor 113 to limit current flow in the event of moisture in the socket. A resistance value of say 10 MΩ would however result in a time for detecting disconnection of the jack detect contact 112 from the first socket contact 103 of a few hundred microseconds, which may be too slow.

Embodiments of the present disclosure relate to improved socket monitoring circuitry. In embodiments of the disclosure a socket monitoring circuit comprises a monitor for monitoring a voltage at a monitoring node, the monitoring node being coupled, in use, to a voltage pull-up element and also a jack detect contact of the socket. The monitor is configured to monitor the voltage at the monitoring node against a threshold. A threshold module is configured to vary the threshold depending on an indication of signal activity in a signal path for a first socket contact to which the monitoring node may be electrically connected via a pole of a plug when inserted in the socket.

Figure 3:
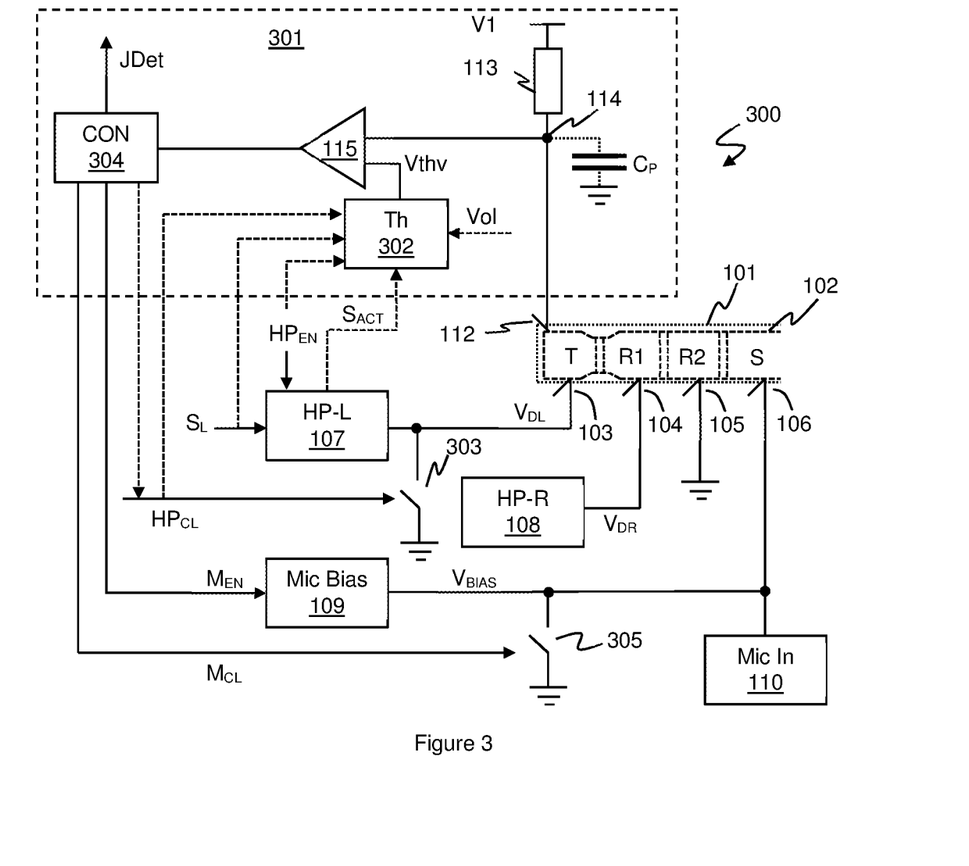
FIG. 3 illustrates one example of a socket arrangement with socket monitoring circuitry according to an embodiment.

FIG. 3 illustrates one example of a socket arrangement 300 having a monitoring circuit 301 according to an embodiment in which similar components to those discussed previously are identified by the same reference numerals.

The monitoring circuit 301 again comprises a monitoring node 114 coupled to a jack detect contact 112 of the socket 101. As discussed above the jack detect contact 112 is arranged to make contact with the same pole of a plug 102 as one of the other socket contacts 103-106, when a plug 102 is present and fully inserted within the socket 101. As described above the jack detect contact 112 may advantageously be arranged to make contact with the tip T pole of the plug 102 and thus may, when the plug 102 is fully inserted, be electrically connected to a first socket contact 103 which may, in use, receive a signal $V_{DL}$ from a first driver circuit 107, which may be an audio driver circuit.

The monitoring node 114 is connected to a pull-up element 113, in this example a resistor connected to a first voltage V1. A monitor 115, which in this example comprises a comparator, is arranged to monitor the voltage $V_M$ at the monitoring node 114 against a threshold. In embodiments of the disclosure however the threshold is a variable threshold Vthv. In this example the variable threshold Vthv applied is controlled by a threshold module 302.

The threshold module 302 is responsive to an indication of any signal activity for the signal path connected to the first socket contact 103, i.e. the extent of activity of the signal $V_{DL}$ applied to the first socket contact 103. In particular the variable threshold Vthv may be set to be relatively low for relatively lower levels of signal activity at the first socket contact 103 and may be set to be higher for relatively higher levels of signal activity at the first socket contact 103.

Such an arrangement can advantageously allow use of a pull-up element 113 that provides a relatively low current in use, e.g. a pull-up resistor 113 with a relatively high resistance value, say of the order of several megaohms or tens of megaohms, but still allow the monitoring circuitry 301 to detect plug removal fast enough to prevent unwanted audible artefacts, for instance by disabling the microphone bias $V_{BIAS}$.

Setting the variable threshold Vthv to a lower level means that the voltage $V_M$ of the monitoring node 114 will reach the threshold level faster following disconnection of the jack detect socket contact 112 from the first socket contact 103 on onset of plug removal.

Figure 4:
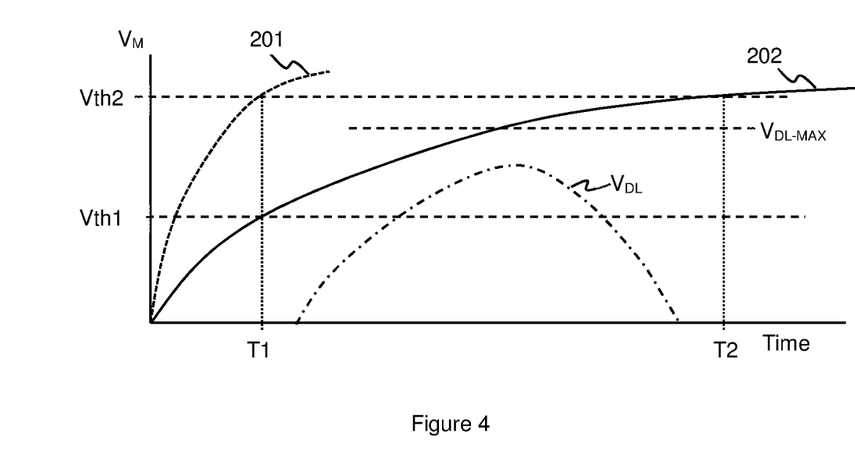
FIG. 4 illustrates the principles of applying different thresholds for the voltage at the monitoring node.

FIG. 4 illustrates the principle. FIG. 4 illustrates the same plot 202 as FIG. 2, showing how the voltage $V_M$ at the monitoring node 114 may increase from ground, on electrical disconnection of the jack detect contact 112 from the first socket contact 103, if the value of resistance for pull-up resistor 113 is relatively high. As discussed above the time taken for the voltage $V_M$ to reach a relatively high threshold value, in this instance Vth2 at a time T2, may be relatively long, for instance of the order of a few hundred microseconds. Such a detection time period may be too slow to prevent audible artefacts as the plug 102 is removed. In embodiments of the disclosure the variable threshold Vthv may therefore, in defined circumstances, be set to be a lower value Vth1. It will take less time for the voltage $V_M$ at the monitoring node 114 to reach this lower threshold Vth1, at a time T1, than the higher threshold vth2, and thus disconnection of the plug 102 may be detected faster. FIG. 4 also illustrates, for comparison, the same plot 201 from FIG. 2 showing how the voltage $V_M$ could change for a lower resistance value of pull-up resistor 113, as may be more conventional, and illustrates that the lower threshold Vth2 could, in some implementations, be set so as to provide a comparable time for detecting disconnection as would be the case using the higher threshold Vth2 and lower resistance value of pull-up resistor 113.

It will be appreciated however that, in use with the plug 102 fully inserted in the socket 101, any driving signal $V_{DL}$ supplied to the first socket contact 103 by the audio driver circuit 107 may be coupled to the voltage monitoring node 114 via the T pole of the plug. Conventionally the threshold Vth illustrated in FIG. 2 would be set to be outside the normal operational signal range of the driving signal $V_{DL}$ supplied to the first socket contact 103, i.e. greater than the maximum expected signal driving voltage $V_{DL-MAX}$, and thus, in use, the threshold Vth would only be exceeded if the plug 102 were disconnected.

In embodiments of the present disclosure however, the threshold module 302 may be operable so as to, in some circumstances, set the variable threshold Vthv to a first threshold level vth1 which is within the possible range of a driving signal $V_{DL}$ that could be supplied to the first socket contact, i.e. the first threshold level Vth1 may be lower than the maximum possible signal driving voltage $V_{DL-MAX}$. FIG. 4 illustrates a possible driving signal $V_{DL}$ and illustrates that this signal $V_{DL}$ could cause the voltage $V_M$ at the monitoring node 114 to exceed the lower threshold Vth1. Were the variable threshold Vthv to be set to the first threshold level Vth1 at the same time that a significant driving signal $V_{DL}$ were being supplied to the first socket contact 103, the driving signal $V_{DL}$ could result in the threshold Vth1 being exceeded at the monitoring node 114, which could result in a false indication of disconnection of the plug 102.

The threshold module 302 is thus configured to set the variable threshold Vthv based on an indication of activity of the signal $V_{DL}$ at the first socket node 103 such that the variable threshold Vthv is set with knowledge of the expected signal level at the first socket node 103. In this way the variable threshold Vthv can be set to an appropriate level which is higher than any expected component of the driving signal $V_{DL}$.

Embodiments of the present disclosure make use of the fact that, if a significant audio driving signal $V_{DL}$ is being driven to the T pole of plug 102 by audio driving circuit 107 at the time that the plug 102 is disconnected, i.e. if a music track say is being played at the time of plug removal, there may in any case be an audible artefact as the drive signals $V_{DL}$ and possible $V_{DR}$ to the loudspeakers of the accessory device are suddenly removed and/or the abrupt end to the audio will tend to mask the occurrence of any artefact due to the microphone bias $V_{BIAS}$ being applied to the R1 and R2 poles of the plug 102 as it is removed. Thus if a significant audio signal $V_{DL}$ is being output to the relevant loudspeaker pole T of the plug 102 at the time that it is removed then it may not be important to disable the microphone bias $V_{BIAS}$ as the plug is removed. In such a case a relatively long detection time for detecting disconnection of the plug 102, say over the order of a few hundred microseconds may be acceptable.

However if there is no or only a low level signal $V_{DL}$ being output to the loudspeaker pole T of the plug 102 when it is removed, which may indicate that any audio playback corresponds to a quiet or silent period or playback has been paused or stopped, then the effect of the microphone bias $V_{BIAS}$ being applied to other poles of the plug 102, e.g. the R1 and R2 poles of the plug 102, as it is removed may be noticeable for a user of the accessory apparatus. In such a case however the signal $V_{DL}$ supplied to the first socket contact 103 will be low in level and the voltage at the first socket contact 103 will remain near ground. Thus a lower threshold value Vth1 can be used for the variable threshold Vthv without risk of the drive signal $V_{DL}$ causing the voltage at the monitoring node $V_M$ to exceed the threshold Vth1. Using the lower threshold Vth1 means that if the plug 102 is removed at such a time, the monitor 115 will detect the disconnection much faster, say within 100 μs or less, which can allow the microphone bias $V_{BIAS}$ to be disabled in sufficient time to reduce the chance of any audible artefacts as the plug 102 is removed.

In some embodiments the threshold module 302 may thus apply a first threshold Vth1 during any periods of relatively low level of signal activity at the first socket contact 103 and may apply a second, higher, threshold Vth2 during any period of higher signal activity at the first socket contact 103.

The threshold monitor 302 may determine the level of signal activity at the first socket contact 103 in a variety of ways.

In some instances the threshold module 302 may be responsive to a signal $HP_{EN}$ which enables or disables at least some aspects of the audio driver circuitry 107, such as a driver amplifier. Typically when not being used to drive an audio signal $V_{DL}$ the audio driver circuitry 107 may be at least partly disabled to reduce power consumption. In some instances the enable signal $HP_{EN}$ for enabling or disabling the audio driver circuitry 107 could be used as the indication of signal activity. If the audio driver circuitry 107 is not enabled then clearly no drive signal $V_{DL}$ would be expected and a first low threshold value Vth1 could be used. Once the audio driver circuitry 107 is enabled it may be expected that a drive signal $V_{DL}$ may be produced and a second higher threshold value Vth2 may be used.

Additionally or alternatively the threshold module 302 may be responsive to a signal $HP_{CL}$ for clamping the output path for the audio driver circuitry 107 to ground. Typically a clamp switch 303 will be provided to selectively clamp the output of the audio driver circuitry 107 to ground when not being used. When the ground clamp is enabled the first socket contact 103 will thus be clamped to ground and the lower threshold value Vth1 may be used. Again when the clamp switch 303 is disabled it may be expected that the audio circuit may drive some no-zero signal $V_{DL}$ to the first socket contact 103 and the higher threshold value Vth2 may be used.

In some embodiments the audio driver circuitry 107 may provide an indication $S_{ACT}$ of signal activity. This could for instance be derived by monitoring some aspect of operation of the audio driver circuitry 107. For example in some implementations the audio driver circuitry 107 may comprise an envelope detector or similar (not separately indicated) for detecting an envelope or peak level of the audio signal for controlling some aspect of operation of the audio driver circuitry 107, e.g. a power supply to an amplifier of the audio driver circuitry 107, and the indication of activity signal $S_{ACT}$ could comprise the peak or envelope value. In such a case the threshold module 302 may be operable to implement more than two different threshold values for the variable threshold Vthv with the relevant threshold value being selected based on the indication of peak or envelope value for the audio signal. In some embodiments the audio driver circuit 107 may comprise a low level detector for detecting a low-level part of the audio signal and the indication Act of the signal activity may be obtained from the low level detector.

In some instances the threshold module 302 could receive a signal $S_L$ from some processing module upstream of the audio driver circuit 107 which is indicative of the signal activity. This could for instance be a digital version of the audio signal for producing the audio driving signal $V_{DL}$ or some parameter such as an envelope or peak value determined upstream.

In some embodiments the indication of signal activity may additionally or alternatively comprise a volume control signal, Vol, indicating some user or system controlled volume setting. If the volume signal indicates that some volume controlled gain has been applied, resulting in a low level signal $V_{DL}$, this may be taken as an indication of signal activity at the first socket node 103.

Based on the indication of signal activity the threshold module 302 controls the variable threshold Vthv. In some embodiments the threshold module 302 may generate different analogue threshold voltages, e.g. Vth1 and Vth2, depending on the indication of signal activity. For instance the threshold module could generate a suitable digital threshold value which is converted to analogue by a digital-to-analogue converter, or the threshold module may control the tap point from one or more potential dividers etc. One skilled in the art would be well aware of various ways in which different threshold voltages could be generated.

In some implementations the threshold module 302 could output a digital threshold value Vthv and the monitor 115 could convert the voltage $V_M$ at the monitoring node to a digital signal for comparison with the threshold.

Figure 5:
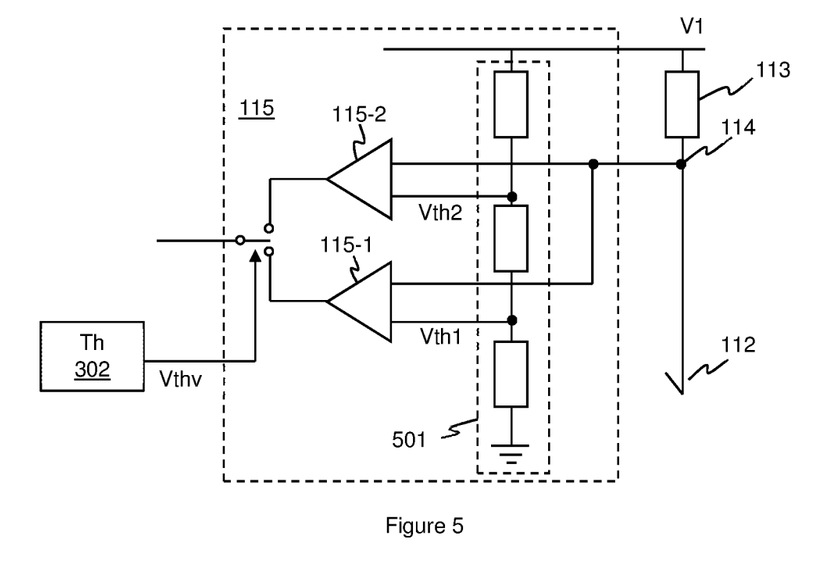
FIG. 5 illustrates one example of a monitor for monitoring the voltage at the monitoring node.

In some embodiments the monitor may comprise multiple comparator elements which each monitor the voltage $V_M$, or version thereof, with a respective threshold and threshold module 302 may effectively select which comparator element is used based on the indication of signal activity. FIG. 5 illustrates one example of monitor 115 which comprises comparators 115-1 and 115-2 arranged to compare the voltage $V_M$ with first and second thresholds Vth1 and Vth2 respectively. In this example the respective threshold are derived from a potential divider 501 but the threshold voltages could be derived in other ways, e.g. from separate potential dividers or reference voltage generators etc. The threshold module 302 effectively selects which comparator to use based on the indication of signal activity.

FIG. 4 illustrates that in the presence of an indication of signal activity, the variable threshold is switched from a lower value Vth1 to a higher value Vth2. This increases the response time and thus increases the likelihood of transient audible artefacts. These may often but not always be adequately masked by an audio signal present. However in some embodiments, as a result of an indication of signal activity, the value of the pull-up resistance 113 may be switched to a lower value, in addition to switching to a higher threshold. Thus the response to removal may be more similar to that of curve 201, rising to Vth2 by time T1, or at least by some time less than T2, providing a more rapid reaction than curve 202. In many host devices there is unlikely to be audio signal activity at the jack contacts once the host system becomes aware that a jack has been pulled out, thus there are unlikely to be prolonged periods of time when the lower resistance is selected while the socket is empty, thus mitigating any moisture-related corrosion reliability issues. The pull-up resistance 113 may comprise elements in series or parallel, which may be switched in and out of circuit by switches, for example using MOS transistors as switches. In some embodiments the pull-up resistance may be replaced wholly or partly by another type of pull-up element, for instance a current source of programmable value.

Referring back to FIG. 3, the output of monitor 115 may be provided to a controller 304 which may determine the connection status of the plug based on the output of the monitor 115. In particular the controller 304 may determine disconnection of the plug 102 if the output of the monitor 115 indicates that the voltage $V_M$ at the monitoring node goes from being below the threshold to above the threshold. The controller may be configured to control operation of at least one signal path to one of the socket contacts 103-106. The controller 304 may, for instance, generate control signals, for instance so as to control the signals/voltages applied to at least one of the other socket contacts 104-106 to avoid the possibility of unwanted audible artefacts.

For example in some embodiments the controller 304 may be configured to generate a control signal $M_{EN}$ for enabling or disabling the microphone biasing circuitry 109 so as to enable or disable the microphone bias $V_{BIAS}$ based on whether a jack plug 102 is present or not. In particular when the output of the monitor 115 changes state to indicate that the jack detect contact 112 is no longer electrically connected to the first socket contact 103, the controller 304 may generate or control the $M_{EN}$ signal to disable the microphone biasing circuitry 109, which may in some embodiments including switching one or more capacitors coupled to the biasing path to discharge and/or to be isolated from the biasing path. Additionally or alternatively the controller 304 may activate a clamping switch 305 for clamping the microphone biasing path to ground.

In some embodiments the controller 304 may also control the enabling or disabling of the audio driver circuits 107 and/or 108 and/or may control clamp switches, e.g. clamp switch 303, for clamping the outputs of the audio driver circuits 107 and/or 108 to ground. The controller may also generate a jack detect signal JDet for some other component of the device, e.g. an applications processor or the like to take appropriate action.

Embodiments of the disclosure thus allow the use of pull-up elements that provide a more limited current flow in use than pull-up elements that would conventionally be used for jack detect socket monitoring, thus reducing the problem of unwanted current flow due to moisture within the socket and possible damage/corrosion. The slower rate of voltage change at the monitoring node is compensated by using a lower than conventional threshold voltage during period when the signal activity of a signal path that couples to the monitoring node is relatively low.

Figure 6:
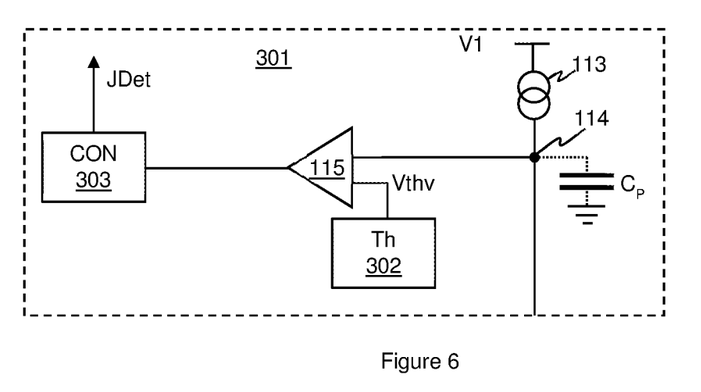
FIG. 6 illustrates socket monitoring circuitry according to another embodiment.

The embodiments described above have discussed the use of pull-up resistors as the pull up elements but other pull-up arrangements may be used, for example FIG. 6 illustrates a socket monitoring circuit with a current source as pull-up element 113.

Embodiments thus provide circuitry for monitoring a socket to detect when a plug has been inserted that do not require the activation of a mechanical switch and can detect the presence of a plug through a resultant electrical connection of two socket contacts. In some embodiments the socket which is monitored may be a socket of a host device, e.g. such as a smartphone or tablet computer or the like.

Figure 7:
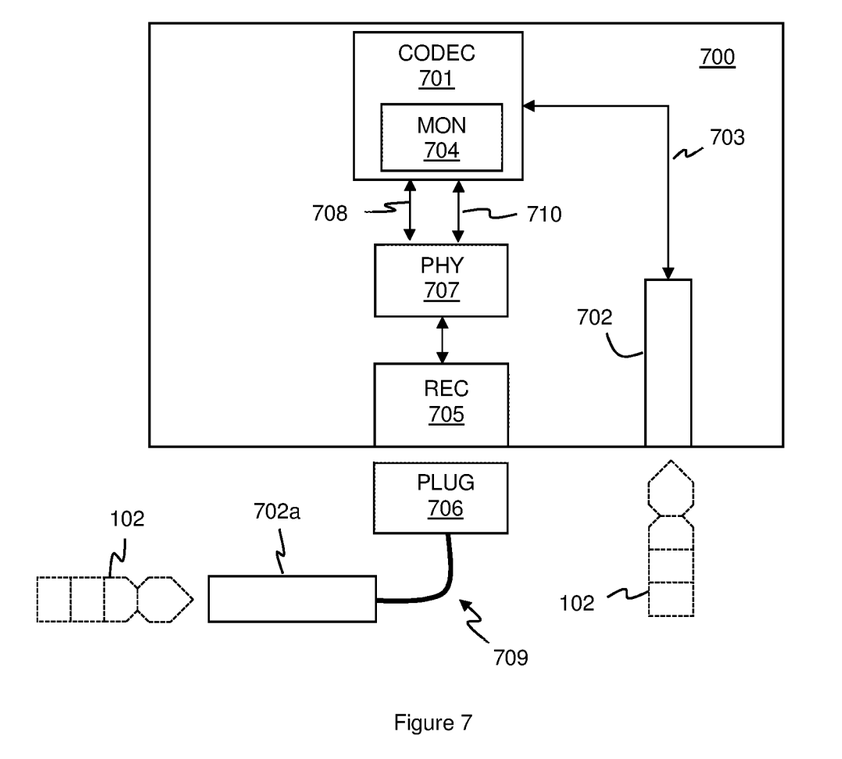
FIG. 7 illustrates a device according to an embodiment.

FIG. 7 illustrates an electronic device 700 which may be any type of electronic device which may be operable with an audio accessory apparatus to output audio to the audio accessory apparatus signals, e.g. for playback, and/or receive audio signals from the audio accessory apparatus, e.g. a microphone signal. The device may therefore comprise an audio circuit, such as a codec 701, capable of input and output of analogue audio signals.

In some implementations the device 700 may have a socket 702, such as a conventional 3.5 mm audio socket for input/output of analogue audio signals. The socket 702 may for instance be four-pole socket TRRS socket such as described above. The codec 701 may be coupled to the socket 702 via suitable signal paths 703. A monitoring circuit 704, which may be a monitoring circuit such as described above with reference to any of FIG. 3, 5 or 6, is also coupled to the socket 702 and operable to detect the presence of a plug within the socket as discussed above. In this example the monitoring circuit forms at least part of codec 701.

In some instances however the socket monitored by the monitoring circuit 704 may be a socket of an external accessory apparatus, such as an adapter apparatus, which may be connected to the device via some removable connector suitable for general data transfer and operable for digital data transfer.

Many electronic devices may include a connection interface suitable for digital data transfer, for instance a USB connector (e.g. a micro USB or USB-C connector for example) or a Lightening connector. Thus the device 700 may comprise a general purpose connector, for example a USB-C compliant receptacle 705, for receiving a mating connector 706 of an accessory apparatus.

Data transfer via the general purpose connector, i.e. receptacle 705, may be controlled by a physical layer controller PHY 707. PHY 707 may monitor the status of receptacle 705 to determine a connection status and also, when insertion of a suitable plug is detected, to determine the type of accessory connected. In some embodiments the codec 701 may be able to input and output digital audio data via the general purpose connector, i.e. receptacle 705, via suitable digital data paths 708.

In some instances, especially in cases where the device 700 does not have its own dedicated audio socket, i.e. there is no jack-socket for analogue audio, it may be possible to transfer analogue audio to and from an accessory apparatus connected via the general purpose connector, i.e. receptacle 705. For instance the USB Type-C Specification defines an Audio Adapter Accessory Mode. In this mode defined pins of the USB Type-C connector are used for analogue left and right audio signals, a microphone bias/input path and ground, i.e. the conventional connections for a TRRS analogue connector. This makes it possible to use legacy analogue accessory apparatus, such as legacy headsets having a 3.5 mm jack plug, by using a 3.5 mm jack to USB Type-C adapter.

FIG. 7 also illustrates an example of an adapter apparatus 709. The adapter 709 has a plug 706, e.g. a USB-C compliant plug, for mating with the receptacle 705 of device 700. Connected to plug 706 via suitable signals paths is a socket 702a, which may be a conventional 3.5 mm three- or four-pole socket, for instance a TRRS socket suitable for receiving a TRRS plug 102.

In use the general purpose connector of the adapter, e.g. USB-C compliant plug 706, may removably connected to the receptacle 705 of device 700. The PHY 707, which is monitoring receptacle 705, will detect insertion of plug 706. PHY 707 will also detect, for example from the values of certain defined resistances coupled to defined pins when the plug is mated, that the connected accessory is one for which analogue audio transfer is required. Thus for a USB-C connector the PHY 707 will configure the receptacle, e.g. USB receptacle 705, for example to operate in the Analogue Adapter Accessory mode in accordance with Annex A of the USB type-C specification, and signal paths 710 for analogue audio will be established between the codec 701 and external socket 702a. The host device 700 will then be able to transfer analogue audio signals from/to an analogue audio accessory device which is connected to the external socket 702a.

In use the PHY 707 monitors the receptacle 705 for presence of a mating plug 706. When an adapter apparatus 709 is connected, the PHY 707 will determine that a suitable plug is inserted and configure the interface of the receptacle 705 accordingly. There may however still be a desire to determine whether or not there is a plug present in the external socket 702a.

In some embodiments the external socket 702a may have contacts located in the socket that are arranged to contact the same pole of a plug when fully inserted in a similar manner as discussed above, i.e. the external socket could be arranged with two contacts that will be shorted together by one of the poles of the plug when inserted. In such embodiments the PHY 707 may be arranged such that signal paths 710 used in an analogue mode include at least one jack-detect path, e.g. referring back to FIG. 3 the analogue signal paths 710 could include a path from monitoring node 114 of monitoring circuit 704 to a tip contact of the external socket 702a, as well as the normal audio path to the tip contact. In this case the monitoring circuit 704 of the codec 701, can monitor the external socket in the same way as discussed above for a socket of the host device itself. The audio signals for the relevant left and right audio poles of the external socket will be generated and supplied to the relevant contacts of the receptacle 705 by the codec 701 and the monitoring circuitry can obtain an indication of signal activity in the same way as discussed above.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

At least some embodiments may be implemented in a host device, especially a portable and/or battery powered host device. Some embodiments may be implemented in an electronic device which may comprise at least one of: a communication device, a mobile or cellular telephone, a smartphone; a computing device; a laptop, notebook or tablet computing device; a media player; a games device; a wearable device; a smartwatch; a voice controlled device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A socket monitoring circuit comprising:
   a monitor configured to monitor a voltage at a monitoring node against a variable threshold;
   wherein the monitoring node is coupled, in use, to a jack detect contact of the socket and a voltage pull-up element; and
   a threshold module configured to vary said variable threshold depending on an indication of signal activity of a signal path for a first socket contact to which the monitoring node may be electrically connected via a pole of a plug when inserted in the socket.

2. A socket monitoring circuit as claimed in claim 1 wherein the threshold module is configured to set said variable threshold to a first value when said indication of signal activity indicates a first level of activity and to set said variable threshold to a second, higher, value when said indication of signal activity indicates a second greater level of activity.

3. A socket monitoring circuit as claimed in claim 1 wherein said indication of signal activity is an indication of activity of an audio signal path for supplying an audio driving signal to the first socket contact of the socket.

4. A socket monitoring circuit as claimed in claim 1 wherein said first socket contact is a tip contact of the socket for contacting a tip pole of a plug when fully inserted in the socket.

5. A socket monitoring circuit as claimed in claim 1 wherein said indication of signal activity comprises an indication of output signal level for an output of a first driving circuit coupled, in use, to the first socket contact.

6. A socket monitoring circuit as claimed in claim 5 wherein the threshold module is configured to receive the indication of output signal level from the first driving circuit.

7. A socket monitoring circuit as claimed in claim 5 wherein the threshold module is configured to receive the indication of output signal level from a processing module upstream of the first driving circuit.

8. A socket monitoring circuit as claimed in claim 1 wherein said indication of signal activity comprises an indication of whether a driver component of a driving circuit for providing a driving signal to the first socket contact is enabled or not.

9. A socket monitoring circuit as claimed in claim 1 wherein said indication of signal activity comprises an indication of whether a clamp switch for clamping the signal path for the first socket contact to ground is enabled or not.

10. A socket monitoring circuit as claimed in claim 1 wherein said indication of signal activity comprises an indication of a volume control signal.

11. A socket monitoring circuit as claimed in claim 1 wherein a parameter of said pull-up element is variable so as to vary a magnitude of expected current flow between the pull up-element and the jack detect contact of the socket in the event that the jack detect contact is electrically connected to the first socket contact, and wherein the monitoring circuit is configured to vary said parameter of the pull-up element based on said indication of signal activity.

12. A socket monitoring circuit as claimed in 11 wherein the monitoring circuit is configured to vary the parameter of said pull-up element so as to provide a higher magnitude of expected current flow when said indication of signal activity indicates that there is signal activity at said first socket contact than when said indication of signal activity indicates that there is substantially no signal activity at said first socket contact.

13. A socket monitoring circuit as claimed in claim 11 wherein said parameter of said pull-up element comprises a value of resistance coupled, in use, between a first voltage and the monitoring node.

14. A socket monitoring circuit as claimed in claim 11 wherein said parameter of said pull-up element comprises an output current of a programmable current source arrangement.

15. A socket monitoring circuit as claimed in claim 1 wherein said pull-up element comprises at least a first resistor coupled, in use, between a first voltage and the monitoring node.

16. A socket monitoring circuit as claimed in claim 1 wherein said pull-up element comprises a current source.

17. A socket monitoring circuit as claimed in claim 1 further comprising a controller responsive to said monitor and configured to determine a connection status of a plug based on the output of the monitor wherein the controller is configured to determine disconnection of a plug from the socket in the event the output of the monitor changes state to indicate that the voltage at the monitoring node has increased from below the variable threshold to above the variable threshold and wherein, in the event that the controller determines disconnection of a plug from the socket, the controller is configured to generate at least one of:
   a control signal to disable a microphone bias from being applied to a socket contact of the socket; and
   a control signal to enable a clamp switch to clamp a path for a microphone bias to ground.

18. An apparatus comprising:

a socket monitoring circuit as claimed in claim 1;

a socket for receiving a mating plug of an accessory apparatus, the socket comprising said jacket detect contact and said first socket contact arranged so as to contact the same pole of the mating plug when inserted into the socket.

19. An apparatus comprising:

a socket for receiving a mating plug of an accessory apparatus, a first audio driver for outputting an audio drive signal to a first contact of the socket;

a jack detect contact configured such that the jack detect contact and first socket contact make contact with a same pole of the mating plug when inserted;

a voltage pull up element coupled to the jack detect contact; and a monitor for monitoring the voltage at the jack detect contact with a threshold controlled by a threshold module;

wherein the threshold module is configured to controllably vary said threshold based on an indication of the output activity of the first audio driver.

20. A socket monitoring circuit comprising:

a monitor configured to monitor a voltage at a monitoring node against a threshold;

wherein the threshold is variable based on an indication of signal level output from an audio circuit to the socket such that the threshold has a first value when the signal output from an audio circuit to the socket has a first amplitude and the threshold has a second, different, value when the signal output from an audio circuit to the socket has a second, different, amplitude.

\* \* \* \* \*